United States Patent
Kim et al.

(10) Patent No.: US 10,712,780 B2
(45) Date of Patent: Jul. 14, 2020

(54) DISPLAY DEVICE

(71) Applicant: Samsung Display Co., Ltd., Yongin-Si, Gyeonggi-Do (KR)

(72) Inventors: Myung Hwan Kim, Yongin-si (KR); Myeong Hee Kim, Yongin-si (KR); Jung Woo Park, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/671,175

(22) Filed: Nov. 1, 2019

(65) Prior Publication Data

US 2020/0064887 A1    Feb. 27, 2020

Related U.S. Application Data

(62) Division of application No. 15/676,436, filed on Aug. 14, 2017, now Pat. No. 10,496,136.

(30) Foreign Application Priority Data

Aug. 24, 2016  (KR) .......................... 10-2016-0107582

(51) Int. Cl.
  *G06F 1/16*    (2006.01)
  *H01L 27/32*    (2006.01)
  *H01L 51/00*    (2006.01)

(52) U.S. Cl.
  CPC .......... *G06F 1/1652* (2013.01); *G06F 1/1637* (2013.01); *H01L 27/3244* (2013.01); *H01L 51/0097* (2013.01); *H01L 2251/5338* (2013.01); *Y02E 10/549* (2013.01)

(58) Field of Classification Search
  CPC .... G06F 1/1652; G06F 1/1626; G06F 1/1637; H01L 27/3276; H01L 51/0097; H01L 51/524; H01L 51/5253; H01L 51/5256; Y02E 10/549
  See application file for complete search history.

(56) References Cited

U.S. PATENT DOCUMENTS

| | | | |
|---|---|---|---|
| 6,377,324 | B1 | 4/2002 | Katsura |
| 2013/0034685 | A1* | 2/2013 | An ......................... H01L 51/524 428/121 |
| 2013/0037228 | A1* | 2/2013 | Verschoor ............. G06F 1/1652 160/377 |
| 2014/0217382 | A1* | 8/2014 | Kwon ................. H01L 51/0097 257/40 |
| 2014/0218856 | A1 | 8/2014 | Raff et al. |
| 2014/0353874 | A1* | 12/2014 | Han ......................... G06F 1/626 264/265 |

(Continued)

FOREIGN PATENT DOCUMENTS

| KR | 10-2013-0015230 A | 2/2013 |
|---|---|---|
| KR | 10-2014-0122960 A | 10/2014 |

(Continued)

*Primary Examiner* — Steven T Sawyer
(74) *Attorney, Agent, or Firm* — Innovation Counsel LLP

(57) ABSTRACT

A display device includes: a display panel including a first area, a second area, and a bending portion provided between the first area and the second area, the first area overlapping the second area by bending of the bending portion; and a supporter provided in a space defined by the first area, the second area, and the bending portion, and contacting the bending portion and the first area adjacent to the bending portion.

10 Claims, 8 Drawing Sheets

(56) References Cited

U.S. PATENT DOCUMENTS

| | | |
|---|---|---|
| 2014/0355195 A1 | 12/2014 | Kee et al. |
| 2015/0015511 A1 | 1/2015 | Kwak et al. |
| 2015/0021570 A1 | 1/2015 | Kim et al. |
| 2015/0103474 A1* | 4/2015 | Cho .......................... E04C 2/24 |
| | | 361/679.01 |
| 2015/0200375 A1 | 7/2015 | Kim et al. |
| 2015/0268697 A1* | 9/2015 | Nam ..................... G06F 1/1652 |
| | | 428/157 |
| 2016/0014915 A1 | 1/2016 | Posner et al. |
| 2016/0048169 A1 | 2/2016 | Yang et al. |
| 2016/0064466 A1* | 3/2016 | Son .................... H01L 51/0097 |
| | | 257/40 |
| 2016/0085265 A1 | 3/2016 | Park et al. |
| 2016/0093644 A1 | 3/2016 | Ki et al. |
| 2016/0231783 A1* | 8/2016 | Raff .......................... G06F 1/00 |
| 2017/0293194 A1* | 10/2017 | Hou ..................... G06F 1/1637 |
| 2018/0019418 A1* | 1/2018 | Sonoda ............... H01L 27/3276 |

FOREIGN PATENT DOCUMENTS

| | | |
|---|---|---|
| KR | 10-2015-0010411 A | 1/2015 |
| KR | 10-2015-0014713 A | 2/2015 |

\* cited by examiner

DISPLAY DEVICE

CROSS-REFERENCE TO RELATED APPLICATION

This application is a divisional application of U.S. patent application Ser. No. 15/676,436 filed on Aug. 14, 2017, which claims priority to and the benefit of Korean Patent Application No. 10-2016-0107582 filed in the Korean Intellectual Property Office on Aug. 24, 2016, the entire contents of which are incorporated herein by reference.

BACKGROUND

(a) Technical Field

This disclosure relates to a display device.

(b) Description of the Related Art

Display devices such as an organic light emitting device and a liquid crystal display are manufactured by generating a plurality of layers and elements on a substrate. Glass has been used for the substrate of the display device. However, the glass substrate is heavy and easily broken. Further, the glass substrate is rigid so it is difficult to deform the display device. Recently, display devices using a flexible substrate that is light, strong against impacts, and is easily deformed have been developed.

The display device using a flexible substrate may be manufactured to bend at an edge where a pad portion to which a flexible printed circuit film (FPC) for transmitting signals is located, thereby reducing a dead space compared to the display device using a rigid substrate. When the dead space is reduced, a bezel width of the display device may be reduced and usage of an inner space of the display device may be increased so the display device may be manufactured to be more compact.

The above information disclosed in this Background section is only for enhancement of understanding of the background of the invention and therefore it may contain information that does not form the prior art that is already known in this country to a person of ordinary skill in the art.

SUMMARY

Embodiments provide a display device for improving reliability of a bending portion of a display panel.

An exemplary embodiment provides a display device including: a display panel including a first area, a second area, and a bending portion connecting the first area with the second area, the first area overlapping the second area, the bending portion being bent; and a supporter provided in a space defined by the first area, the second area, and the bending portion, and contacting the bending portion and the first area adjacent to the bending portion.

The supporter may be bonded by the supporter to at least a portion of each of the bending portion and the first area.

The supporter may contact at least a portion of the second area.

The first area and the second area may be substantially flat.

The supporter may be a thermoplastic resin or a polymer made of a thermosetting resin, a photo-curable resin, or a moisture-curable resin.

A thickness of the bending portion may be greater than a thickness of a portion of the display device where the first area overlaps the second area.

A thickness of the bending portion may be substantially equal to a thickness of a portion of the display device where the first area overlaps the second area.

The first area may include a display area for displaying an image, and the second area may include a pad portion.

The display device may further include: an integrated circuit chip installed in the second area; and a flexible printed circuit film bonded to the pad portion.

A thickness of the bending portion may be equal to or greater than a thickness of a portion of the display device where of the integrated circuit chip overlaps the second area.

Another embodiment provides a method for manufacturing a display device, including: providing a display panel including a first area, a second area, and a bending portion provided between the first area and the second area; applying a supporter forming material to the bending portion; and curing the supporter forming material to form a supporter while the bending portion is bent.

The method may further include bending the bending portion before applying the supporter forming material.

The method may further include bending the bending portion after applying the supporter forming material.

The supporter forming material may be a hot melt that is melted or a liquid resin.

The liquid resin may be a photo-curable resin, a thermosetting resin, or a moisture-curable resin.

The supporter may be formed to be provided in a space defined by the first area, the second area, and the bending portion, and the supporter may be formed to contact at least a portion of each of the bending portion and the first area.

The supporter may be formed to contact at least a portion of the second area.

A thickness of the bending portion may be greater than a thickness of a portion of the display device where the first area overlaps the second area.

A thickness of the bending portion may be substantially equal to a thickness of a portion of the display device where the first area overlaps the second area.

The first area may include a display area for displaying an image, and the second area may include a pad portion.

According to the exemplary embodiments, the supporter corresponding to the bending portion of the display panel may be efficiently provided with a reduced number of processes and cost, and the reliability of the bending portion may be improved.

DETAILED DESCRIPTION OF THE EMBODIMENTS

Figure 1:
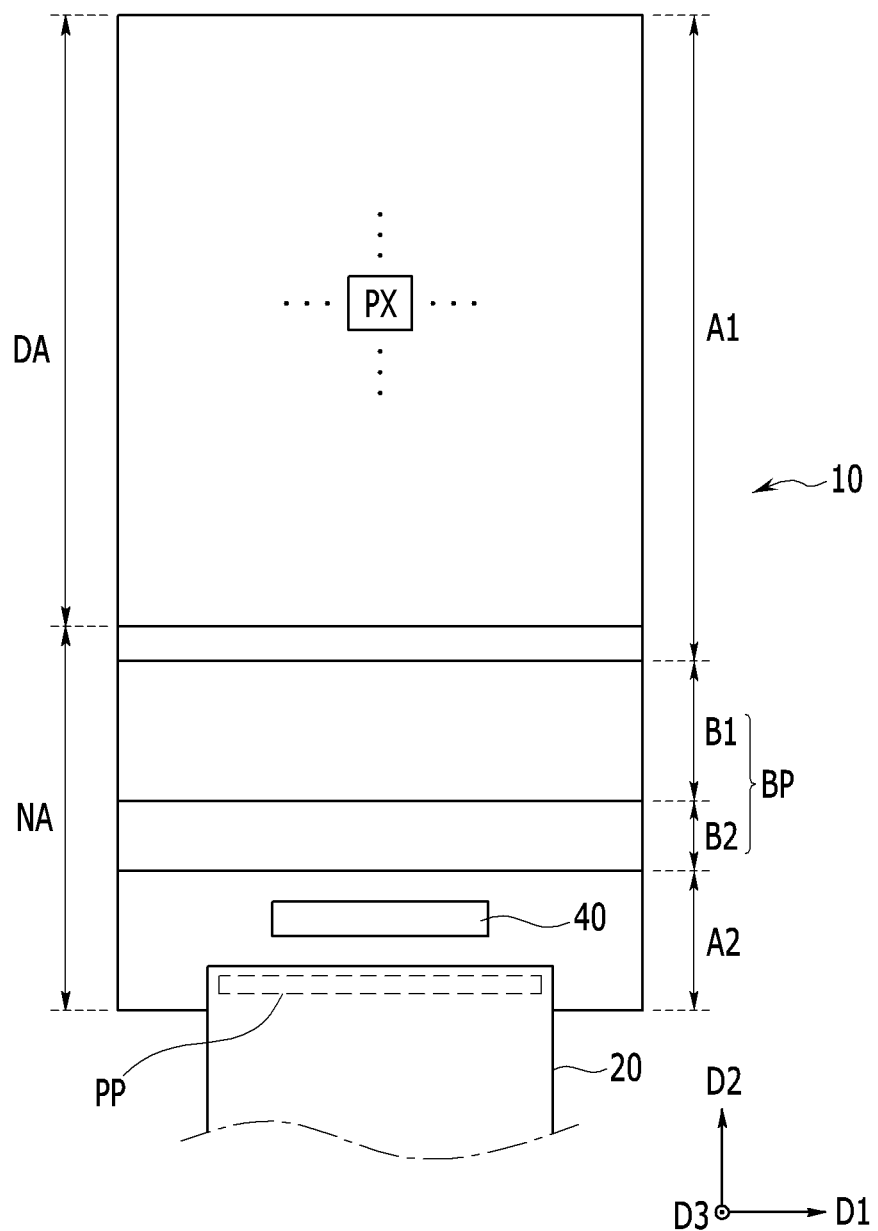
FIG. 1 shows a top plan view before a display device according to an exemplary embodiment of the present inventive concept is bent.

The present inventive concept will be described more fully hereinafter with reference to the accompanying drawings, in which exemplary embodiments of the invention are shown. As those skilled in the art would realize, the described embodiments may be modified in various different ways, all without departing from the spirit or scope of the present inventive concept.

Parts that are unrelated to the description of the exemplary embodiments are not shown to make the description clear, and like reference numerals designate like element throughout the specification.

The size and thickness of each component shown in the drawings are arbitrarily shown for better understanding and ease of description, but the present inventive concept is not limited thereto. In the drawings, the thickness of layers, films, panels, areas, etc., are exaggerated for clarity. For better understanding and ease of description, the thickness of some layers and areas is exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

A display device according to an exemplary embodiment of the present inventive concept will now be described with reference to accompanying drawings.

Figure 2:
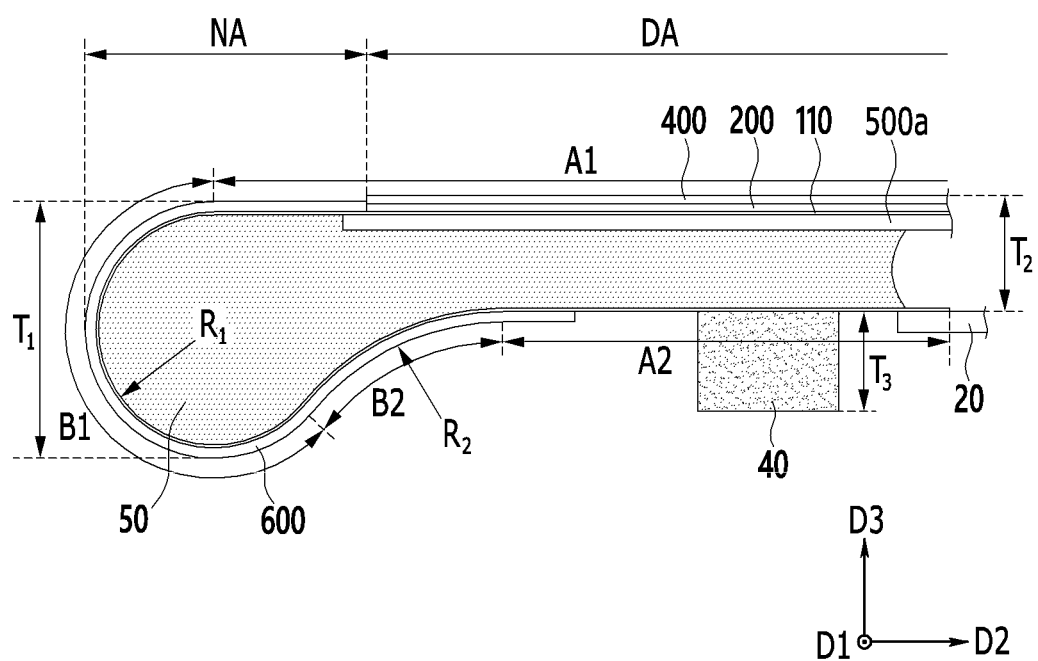
FIG. 2 shows a side view of an exemplary embodiment after a display device shown in FIG. 1 is bent.
Figure 3:
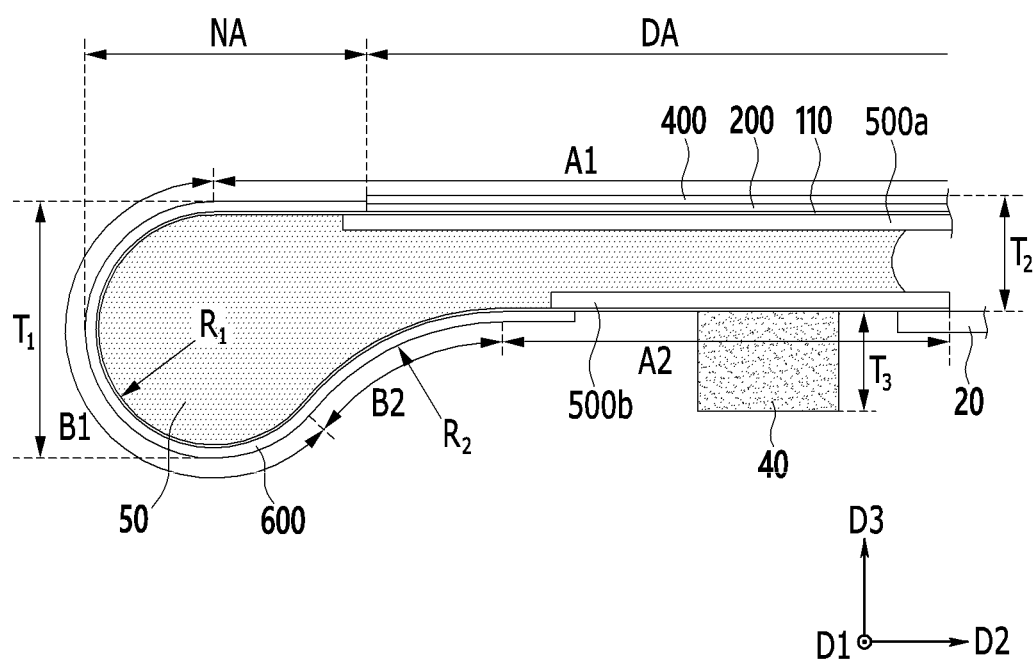
FIG. 3 shows a side view of an exemplary embodiment after a display device shown in FIG. 1 is bent.
Figure 4:
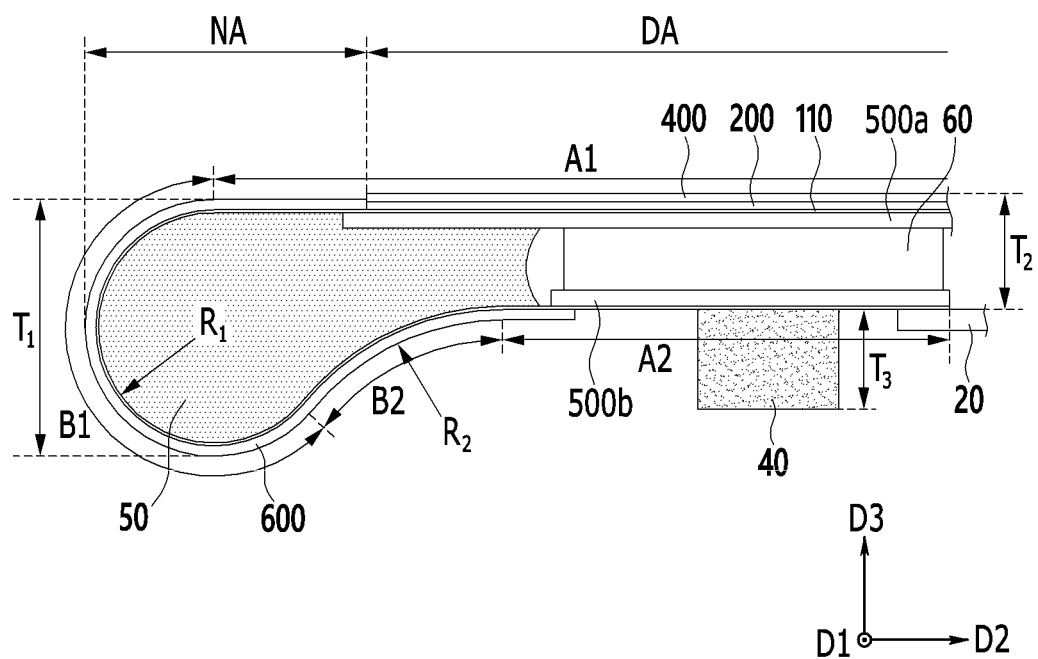
FIG. 4 shows a side view of an exemplary embodiment after a display device shown in FIG. 1 is bent.
Figure 5:
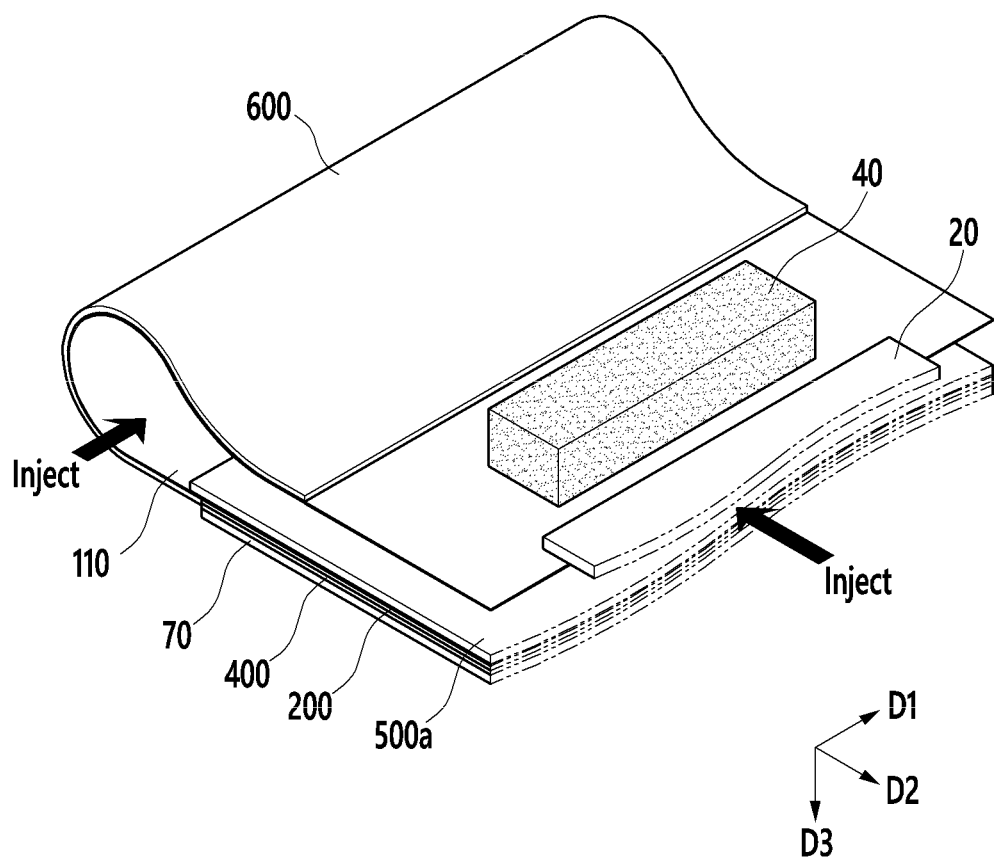
FIG. 5 shows a process for manufacturing a display device shown in FIG. 2.

FIG. 1 shows a top plan view before a display device according to an exemplary embodiment of the present inventive concept is bent, FIG. 2, FIG. 3, and FIG. 4 show a side view of an exemplary embodiment after a display device shown in FIG. 1 is bent, and FIG. 5 shows a process for manufacturing a display device shown in FIG. 2.

Referring to FIG. 1, the display device includes a display panel 10 and a flexible printed circuit film 20 connected to the display panel 10.

The display panel 10 including a substrate 110 on which elements for displaying an image to a flexible substrate includes a display area DA for displaying an image, and a non-display area NA, provided outside the display area DA, on which elements and/or wires for generating and/or transmitting various signals applied to the display area DA are disposed. FIG. 1 shows that a lower area of the display panel 10 is indicated as the non-display area NA, and a right edge, a left edge, and/or an upper edge of the display panel 10 may correspond to the non-display area NA.

The display area DA of the display panel 10 may include a display layer 200 and an anti-reflection layer 400 on the substrate 110. Pixels PX are exemplarily disposed in a matrix form on the display layer 200. Signal lines such as gate lines (not shown) or data lines (not shown) are disposed in the display layer 200. The gate lines may mainly extend in a first direction D1 (e.g., a row direction), and the data lines may extend in a second direction D2 (e.g., a column direction) crossing the first direction D1. Each pixel PX may be connected to the gate line and the data line to receive a gate signal and a data signal from the same signal lines. In the case of the organic light emitting device, for example, driving voltage lines (not shown) extending in the second direction D2 and transmitting a driving voltage to the pixels PX may be disposed in the display area DA. In the case of the liquid crystal display, a polarization layer may be provided instead of the anti-reflection layer 400.

The display area DA may further include a touch sensor layer (not shown) for sensing a user's contacting or non-contacting touch. The quadrangular display area DA is shown, and the display area DA may have various kinds of shapes such as a polygon, a circle, or an oval in addition to the quadrangle.

A pad portion PP including pads (not shown) for receiving signals from outside of the display panel 10 is provided on the substrate 110 in the non-display area NA of the display panel 10. The pads of the pad portion PP are connected to wires disposed in the non-display area NA. A first end of the flexible printed circuit film 20 is attached to the pad portion PP. A second end of the flexible printed circuit film 20 may be exemplarily connected to an external printed circuit board (PCB) (not shown) to transmit signals such as image data.

A driving device for generating and/or processing various kinds of signals for driving the display panel 10 may be provided in the non-display area NA, and may be provided on the flexible printed circuit film 20 attached to the pad portion PP. The driving device may include a data driver for applying a data signal to the data line, a gate driver for applying a gate signal to the gate line, and a signal controller for controlling the data driver and the gate driver.

The data driver is installed as an integrated circuit chip 40 in the non-display area NA between the display area DA and the pad portion PP. Alternatively, the data driver may be mounted as an integrated circuit chip on the flexible printed circuit film 20 and may be connected as a tape carrier package (TCP) to the pad portion PP. The gate driver may be provided as an integrated circuit chip or may be integrated in a non-display area (not shown) on the left/right edge of the display panel 10. The signal controller may be formed with a same integrated circuit chip 40 as the data driver or may be provided as a separate integrated circuit chip.

Referring to FIG. 1, FIG. 2, FIG. 3, and FIG. 4, the display panel 10 includes a bending portion BP between the display area DA and the pad portion PP. As shown in FIG. 2, FIG. 3, and FIG. 4, the bending portion BP represents an area that is bent with a predetermined curvature radius on the display panel 10. The bending portion BP is provided to traverse the display panel 10 in the first direction D1, for example, the bending portion BP is provided to traverse the entire length of the display panel 10 in the first direction D1. The display panel 10 may be bent with respect to a bending axis in parallel to the first direction D1, and for example, as shown in FIG. 2, FIG. 3, and FIG. 4, the flexible printed circuit film 20 may be provided behind or at a far end portion of the display area DA as a result of the bending. Wires for transmitting the signals that are input through the pads of the pad portion PP to the driving device or the display area DA are provided on the substrate 110 on the bending portion BP. A bending protection layer 600 or a stress neutralization layer may be provided on wires in the bending portion BP to mitigate a tensile stress or protect the wires. The bending portion BP is shown to be provided in the non-display area NA in the drawing, and the bending portion BP may be provided in the display area DA and the non-display area NA, or in the display area DA.

In a viewpoint of the bending portion BP, the display panel 10 provides a bending portion BP, a first area A1 provided on a first side of the bending portion BP, and a second area A2 provided on a second side of the bending portion BP. The first area A1, the bending portion BP, and the second area A2 are continuously provided, i.e., the bending portion BP connects the first area A1 and the second area A2. The first area A1 may include the display area DA, and the integrated circuit chip 40 and the pad portion PP may be provided in the second area A2. In the illustrated exemplary embodiment, the non-display area NA includes an area between the display area DA and the bending portion BP, the bending portion BP, and the second area A2. While the display panel 10 is bent, the first area A1 overlaps the second area A2. The first area A1 and the second area A2 may be substantially flat.

A protective film 500a for protecting the display panel 10 is attached to a rear side of the first area A1. A protective film 500b may be attached to a rear side of the second area A2 as shown in FIG. 3 and FIG. 4, or it may not be attached thereto as shown in FIG. 2. For example, the protective films 500a and 500b may be made of a polymer such as polyethylene terephthalate, polyethylene naphtha late, polyimide, or polyethylene sulfide, and their thickness may be about 50 to 150 micrometers, but they are not limited thereto. Alternatively, the protective films 500a and 500b may not be provided as shown so as to reduce the bending stress on the bending portion BP. The protective films 500a and 500b may partly overlap the bending protection layer 600 as shown, or they may not overlap the same, differing from the drawing.

The bending portion BP may include a first bending portion B1 and a second bending portion B2 with different curvature radii R1 and R2. While the display panel 10 is bent, a bending axis of the first bending portion B1 may be provided inside the display panel 10, and a bending axis of the second bending portion B2 may be provided outside the display panel 10. The first bending portion B1 may be provided near the first area A1, and the second bending portion B2 may be provided near the second area A2. The curvature radius R2 of the second bending portion B2 may be greater than the curvature radius R1 of the first bending portion B1. When the first bending portion B1 and the second bending portion B2 are bent with different positions of the bending axis and the curvature radii R1 and R2, a thickness T2 of the display device on a portion where the first area A1 overlaps the second area A2 may be less than a thickness T1 of the display device on the first bending portion B1.

The curvature radii R1 and R2 may be set such that the thickness T1 of the display device on the first bending portion B1 may be equal to or greater than a sum of the thickness T2 of the display device at the portion where the first area A1 overlaps the second area A2 and a thickness T3 of the integrated circuit chip 40. In this case, the thickness of the display device may be designed to be equal to or less than the thickness of the first bending portion B1, and the integrated circuit chip 40 is prevented from being damaged by minimizing protruding of the integrated circuit chip 40 from the display device.

The bending portion BP may further include at least one sub-bending portion (not shown) between the first bending portion B1 and the second bending portion B2, and the curvature radius of the sub-bending portion may be greater than the curvature radius R2 of the second bending portion B2. The bending portion BP may substantially include only a portion that is bent with a single curvature radius, and for example, the bending portion BP may include only the first bending portion B1 and not the second bending portion B2.

A supporter 50 is provided in a space defined by the first area A1, the bending portion BP, and the second area A2 (referred to as an internal bending space hereinafter). The supporter 50 with a shape corresponding to an inner side of the internal bending space fills the internal space. Therefore, the supporter 50 closely contacts the bending portion BP, a portion of the first area A1, and the second area A2. In further detail, referring to FIG. 2 and FIG. 3, the supporter 50 may closely contact surfaces of the protective films 500a and 500b on a portion to which the protective films 500a and 500b are attached, and the supporter 50 may closely contact a surface of the substrate 110 on a portion to which the protective film 500a is not attached in a like manner of the bending portion BP. As shown in FIG. 2 and FIG. 3, the supporter 50 may fill most of the internal bending space up to the area in which the first area A1 overlaps the second area A2. For example, the supporter 50 may fill more than about 80% of the internal bending space. As shown in FIG. 4, the supporter 50 may be provided to fill the bending portion BP, or the bending portion BP and a peripheral area. In this case, an adhesive member 60 such as a cushion tape may be provided between the protective films 500a and 500b on a portion where the supporter 50 is not provided in the internal bending space, and the protective films 500a and 500b may be attached to each other by the adhesive member 60. By this, for example, the second area A2 that does not closely contact the supporter 50 may be fixed to the first area A1.

The supporter 50 is bonded to the area of contact between the display panel 10 and the supporter 50. In other words, no other attaching means is provided between the supporter 50 and a contact area of the display panel 10 to attach them, and the supporter 50 is bonded to the display panel 10. The supporter 50 may be a thermoplastic resin, or it may be made of a thermosetting resin, a photo-curable resin, or a moisture-curable resin. The supporter 50 may exemplarily include a polymer such as polyethylene, polypropylene, polystyrene, polycarbonate, polymathic methacrylate, polyethylene terephthalate, polyimide, or polyolefin, and it is not limited thereto.

The bending portion BP is bonded to the supporter 50 so a restoring force of the bending portion BP may be counteracted to maintain the bending curvature, and the display panel 10 may maintain a predetermined bent state. Further, when an external force is applied to the bending portion BP, the supporter 50 provided in the internal bending space supports the bending portion BP, thereby exemplarily preventing the bending portion BP from being pressurized in a direction substantially parallel to the third direction D3, or otherwise deformed, and thereby preventing the wires provided on the bending portion BP from being damaged. A Young's modulus of the supporter 50 may exemplarily be equal to or greater than about 100 MPa so as to support the bending portion BP and prevent the same from being deformed and damaged by an external force.

The supporter 50 having a shape that corresponds to the inner side of the internal bending space generated by the first area A1, the bending portion BP, and the second area A2 may be formed not by inserting a prepared supporter in such a shape but by, for example, injecting a material with fluidity into the internal bending space and curing the same.

In detail, referring to FIG. 5, the bending portion BP may be bent so that the second area A2 may overlap the first area A1, and then a supporter forming material may be injected into the internal bending space in a direction substantially parallel to the first direction D1 from a side of the internal bending space or in a direction substantially parallel to the second direction D2. When the internal bending space is filled with the supporter forming material, the supporter forming material is cooled, or heat or beams are applied to the supporter forming material to be cured, so the supporter 50 having a shape corresponding to the internal bending space is provided in the internal bending space. To prevent the display panel 10 from being damaged when the bending portion BP is bent, a passivation layer 70 may be provided on the anti-reflection layer 400, and the passivation layer 70 may be removed after it is bent.

A hot melt that is melted or a liquid resin may be exemplarily used for the supporter forming material. The liquid resin may be a photo-curable resin, a thermosetting resin, or a moisture-curable resin, and it may be uncured or semi-cured. The hot melt that may be a thermoplastic resin that is melted when it is heated is cured when it is cooled. The resin or the hot melt is adhesive, so the cured supporter 50 may be bonded to the inner side of the internal bending space. Therefore, the supporter 50 may be bonded with the display panel 10 by the supporter 50 without using an additional adhesive means between the supporter 50 and the display panel 10, and the display panel 10 may maintain the bending state of the bending portion BP.

Another method for forming the supporter 50 includes, for example, applying a supporter forming material such as a hot melt that is melted before the bending portion BP is bent or a liquid resin with some viscosity on a rear side of the bending portion BP, bending the bending portion BP as shown in FIG. 4, and curing the supporter forming material. When the supporter forming material is sufficiently applied, the supporter forming material BP may fill the space generated by the bending portion BP when the bending portion BP is bent and then may fill the space generated by portions where the first area A1 overlaps the second area A2.

When the supporter 50 is formed as described by applying the supporter forming material of liquid crystal to the bending portion BP and curing the same, it may reduce the number of processes and the cost compared to the case of attaching a prepared supporter to the bending portion BP. Further, the supporter 50 is formed to closely contact the display panel 10 on the bending portion BP and in its nearby area, so no empty space is provided between the display panel 10 and the supporter 50, thereby preventing accumulated fatigue that may occur because of the space.

A display device according to another exemplary embodiment of the present inventive concept will now be described with a focus on a difference with the above-described display device with reference to FIG. 6 and FIG. 7.

Figure 6:
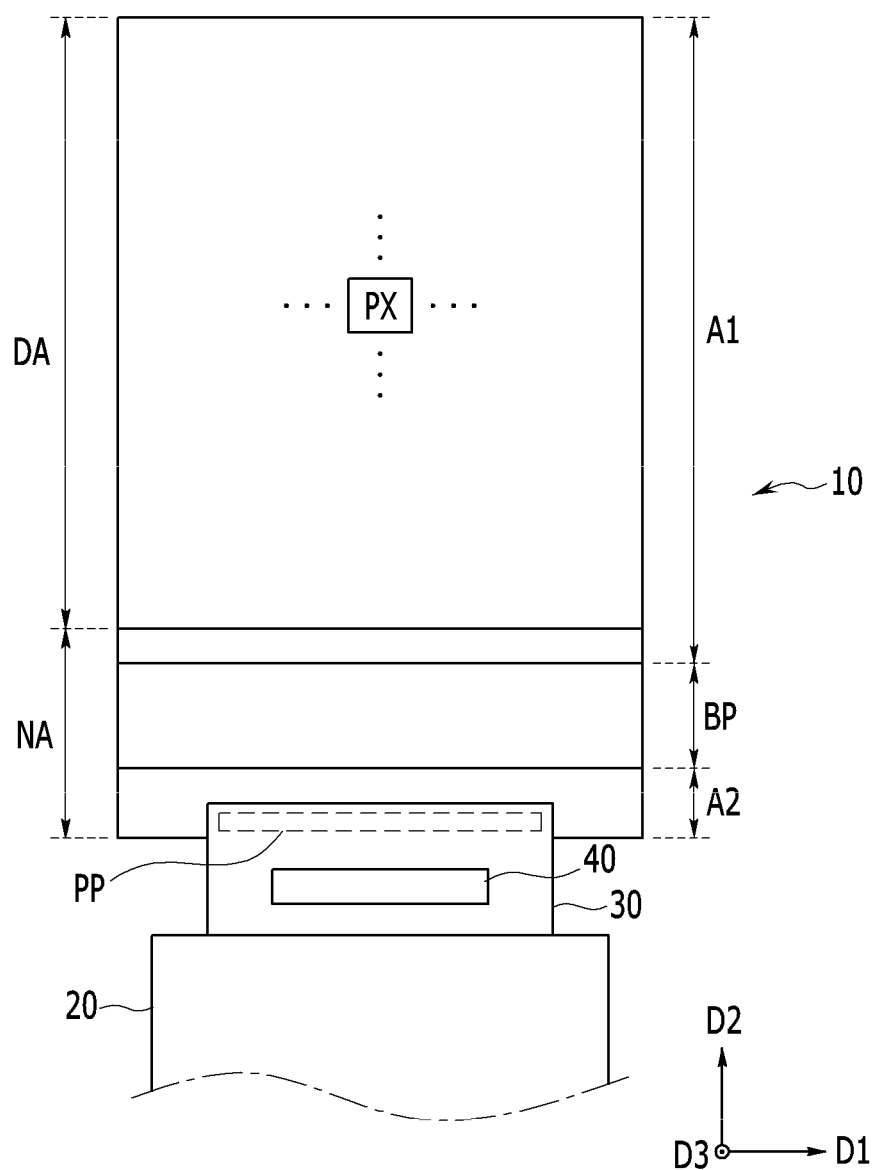
FIG. 6 shows a top plan view before a display device according to an exemplary embodiment of the present inventive concept is bent.
Figure 7:
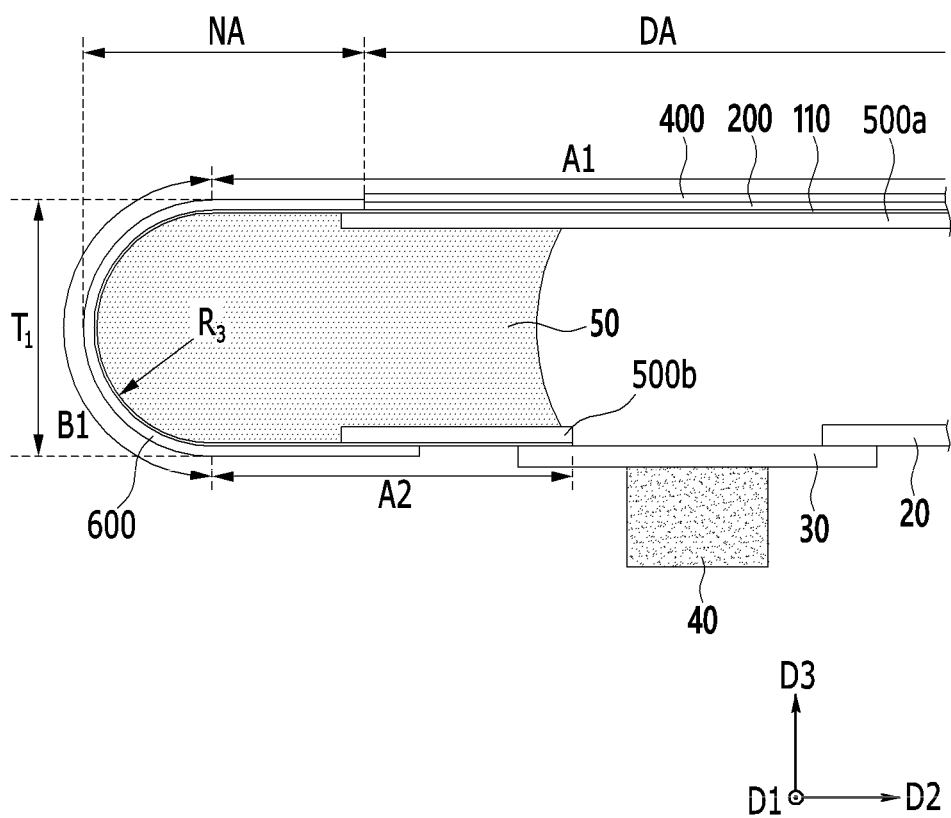
FIG. 7 shows a side view of an exemplary embodiment after a display device shown in FIG. 6 is bent.

FIG. 6 shows a top plan view before a display device according to an exemplary embodiment of the present inventive concept is bent, and FIG. 7 shows a side view of an exemplary embodiment after a display device shown in FIG. 6 is bent.

Differing from the exemplary embodiment shown with reference to FIG. 1 to FIG. 5, regarding the exemplary embodiment shown with reference to FIG. 6 and FIG. 7, the integrated circuit chip 40 that may include a data driver is not installed on the display panel 10 but is installed on a flexible printed circuit film 30 including a first end bonded to the pad portion PP of the display panel 10. The flexible printed circuit film 30 includes a second end connected to the flexible printed circuit film 20, and the flexible printed circuit film 20 may exemplarily be connected to an external printed circuit board (PCB) (not shown) to transmit signals such as image data.

The display panel 10 includes a first area A1, a bending portion BP, and a second area A2. Referring to FIG. 7, the bending portion BP is bent with a curvature radius R3, and the first area A1 overlaps the second area A2 when the bending portion BP is bent. The first area A1 and the second area A2 may be substantially parallel to each other, so the thickness of the display device on the portion where the first area A1 overlaps the second area A2 may be substantially equal to the thickness T1 of the display device on the bending portion BP.

A supporter 50 is provided in an internal bending space generated by the first area A1, the bending portion BP, and the second area A2. The supporter 50 with a shape corresponding to an inner side of the internal bending space fills the internal space, and closely contacts the bending portion BP, a portion of the first area A1, and the second area A2. Differing from the drawing, the supporter 50 may also be formed to fill the bending portion BP and its peripheral area in the internal bending space, and it may be formed to fill the space generated by the first area A1 and the flexible printed circuit film 30. In the latter case, the flexible printed circuit film 30 may be bonded to the supporter 50, thereby preventing the flexible printed circuit film 30 from moving by a weight of the integrated circuit chip 40 when it is processed. A material of the supporter 50 and a method for forming the same may correspond to the previous descriptions so they will not be described.

The display device has been described with a focus on the bending portion BP and the supporter 50 of the display panel 10. The display device will now be described in further detail by exemplifying an organic light emitting device with reference to FIG. 8.

Figure 8:
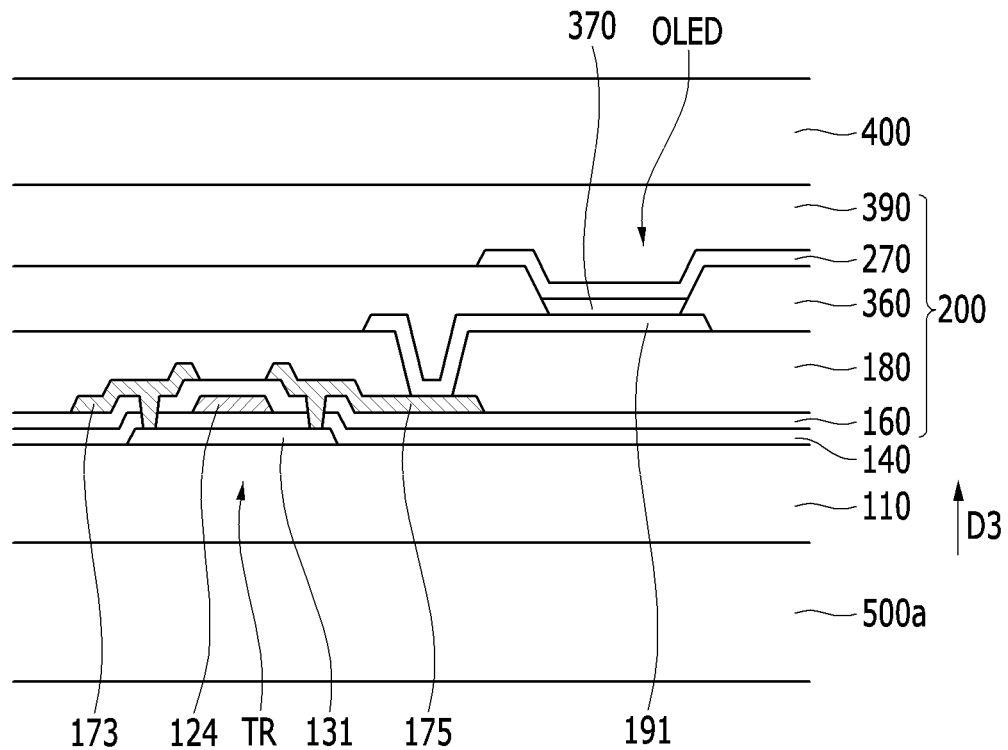
FIG. 8 shows across-sectional view of a stacking structure of a display area of a display device according to an exemplary embodiment of the present inventive concept.

FIG. 8 shows a cross-sectional view of a stacking structure of a display area of a display device according to an exemplary embodiment of the present inventive concept.

FIG. 8 may correspond to one pixel PX area in FIG. 1 and FIG. 6. The display device includes a substrate 110 and a display layer 200 provided on the substrate 110. A plurality of pixels (not shown) are formed on the display layer 200. Each pixel includes transistors and an organic light emitting diode, and a stacked structure of the display device will now be described based on one transistor TR and one organic light emitting diode OLED connected thereto.

The substrate 110 may be a flexible substrate made of a polymer such as polyimide, polyamide, or polyethylene terephthalate. A buffer layer (not shown) or a barrier layer (not shown) for preventing an impurity degrading a characteristic of a semiconductor from spreading and preventing moisture from permeating may be provided inside the substrate 110 and/or provided on the substrate 110.

A semiconductor 131 of a transistor TR is provided on the substrate 110, and a gate insulating layer 140 is provided on the semiconductor 131. The semiconductor 131 includes a source area, a drain area, and a channel area between the areas. The semiconductor 131 may include polysilicon, an oxide semiconductor, or amorphous silicon. The gate insulating layer 140 may include an inorganic insulating material such as a silicon oxide or a silicon nitride.

A gate conductor including a gate electrode 124 of a transistor TR is provided on the gate insulating layer 140. The gate conductor may exemplarily include a metal such as copper (Cu), aluminum (Al), silver (Ag), molybdenum (Mo), chromium (Cr), tantalum (Ta), or titanium (Ti), or a metal alloy thereof.

An inter-layer insulating layer 160 is provided on the gate conductor. The inter-layer insulating layer 160 may include an inorganic material.

A data conductor including a source electrode 173 and a drain electrode 175 of a transistor TR is provided on the inter-layer insulating layer 160. The source electrode 173 and the drain electrode 175 are connected to a source area and a drain electrode of the semiconductor 131 through contact holes formed in the inter-layer insulating layer 160 and the gate insulating layer 140. The data conductor may exemplarily include a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof.

A passivation layer 180 is provided on the data conductor. The passivation layer 180 may include an organic insulating material. A pixel electrode 191 is provided on the passivation layer 180. The pixel electrode 191 may be connected to the drain electrode 175 through the contact hole formed in the passivation layer 180 to receive a data signal for controlling luminance of the organic light emitting diode OLED.

A pixel definition layer 360 is provided on part of the passivation layer 180 and the pixel electrode 191. The pixel definition layer 360 includes an opening overlapping the pixel electrode 191. Regarding the opening of the pixel definition layer 360, an emission layer 370 is provided on the pixel electrode 191, and a common electrode 270 is provided on the emission layer 370. The pixel electrode 191, the emission layer 370, and the common electrode 270 configure an organic light emitting diode OLED. The pixel electrode 191 may be an anode of the organic light emitting diode OLED, and the common electrode 270 may be a cathode of the organic light emitting diode OLED. The common electrode 270 may include a transparent conductive material such as an indium tin oxide (ITO) or an indium zinc oxide (IZO).

An encapsulation layer 390 for protecting the organic light emitting diode OLED is provided on the common electrode 270. The encapsulation layer 390 may include at least one organic material layer and/or at least one inorganic material layer.

An anti-reflection layer 400 for reducing reflection of external light is provided on the encapsulation layer 390, and the anti-reflection layer 400 may be a polarization layer. A protective film 500a for protecting the display panel is provided below the substrate 110. The protective film 500a may be attached to the substrate 110 by an adhesive agent such as a pressure sensitive adhesive (PSA) or an optically clear adhesive (OCA).

The case in which the display device is an organic light emitting device has been described, and the display device may exemplarily be a liquid crystal display including a liquid crystal layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a display device, comprising:
   providing a display panel including a first area, a second area, and a bending portion provided between the first area and the second area;
   bending the bending portion to make the first area overlap the second area and to form a space between the first area and the second area that overlap each other, wherein at least one of the first area and the second area includes pixels for displaying an image;
   after the bending, applying a supporter forming material into at least the space and to the bending portion; and
   after the applying, curing the supporter forming material to form a supporter.

2. The method of claim 1, wherein a distance between the first area and the second area that overlap each other in a direction perpendicular to a face of the first area is less than a thickness of the supporter in the direction perpendicular to the face of the first area.

3. The method of claim 1, wherein at least a portion of the supporter forming material is injected into the space in a direction parallel to a boundary between the bending portion and the first area.

4. The method of claim 1, wherein
   the supporter forming material is a hot melt that is melted or a liquid resin.

5. The method of claim 1, wherein
   the supporter forming material is a photo-curable resin, a thermosetting resin, or a moisture-curable resin.

6. The method of claim 1, wherein a first section of the supporter is closer to the bending portion than a second section of the supporter in a direction parallel to a face of the first area and is thicker than the second section of the supporter in a direction perpendicular to the face of the first area.

7. The method of claim 1, wherein
   the supporter is formed to contact at least a portion of the second area.

8. The method of claim 1, wherein
   a thickness of the bending portion is greater than a thickness of a portion of the display device where the first area overlaps the second area.

9. The method of claim 1, wherein
   a thickness of the bending portion is substantially equal to a thickness of a portion of the display device where the first area overlaps the second area.

10. The method of claim 1, wherein
    the first area includes the pixels, and wherein the second area includes an electrically conductive pad.

* * * * *